US011289664B1

(12) United States Patent
Salah et al.

(10) Patent No.: US 11,289,664 B1
(45) Date of Patent: Mar. 29, 2022

(54) HIGHLY EFFICIENT ORGANIC LIGHT EMITTING DIODE BASED ON DYSPROSIUM INCORPORATED TRIS-(8-HYDROXYQUINOLINE) ALUMINUM

(71) Applicant: KING ABDULAZIZ UNIVERSITY, Jeddah (SA)

(72) Inventors: Numan Salah, Jeddah (SA); Ahmed Salem Alshahrie, Jeddah (SA); Abdu Saeed, Jeddah (SA)

(73) Assignee: KING ABDULAZIZ UNIVERSITY, Jeddah (SA)

( * ) Notice: Subject to any disclaimer, the term of this patent is extended or adjusted under 35 U.S.C. 154(b) by 0 days.

(21) Appl. No.: 17/506,872

(22) Filed: Oct. 21, 2021

(51) Int. Cl.
*H01L 51/00* (2006.01)
*H01L 51/50* (2006.01)
*B82Y 40/00* (2011.01)

(52) U.S. Cl.
CPC ......... *H01L 51/0081* (2013.01); *B82Y 40/00* (2013.01); *H01L 51/5012* (2013.01)

(58) Field of Classification Search
CPC ............................ H01L 51/0081; B82Y 40/00
See application file for complete search history.

(56) References Cited

U.S. PATENT DOCUMENTS

| 7,282,586 B1 * | 10/2007 | Yen ...................... C07D 471/04 313/504 |
| 9,862,883 B2 * | 1/2018 | Salah ..................... C09K 11/06 |
| 2006/0152145 A1 * | 7/2006 | Qiu ........................ C09K 11/06 313/504 |

OTHER PUBLICATIONS

Chan et al., Smart Materials and Structures, Feb. 2006, DOI: 10.1088/0964-1726/15/1/015.*
Curioni et al., JACS 1999, 121, 8216-8220.*

* cited by examiner

*Primary Examiner* — Vu A Nguyen
(74) *Attorney, Agent, or Firm* — WC&F IP

(57) ABSTRACT

An organic light emitting diode (OLED) utilizes dysprosium incorporated tris-(8-hydroxyquinoline) aluminum (Alq3-Dy) as the emissive layer. The OLED, which can be fabricated as a multi-layer device with each layer having a thickness of 30-300 nm, provides a luminance value at a voltage ranging from 24V to 30V of 3000-15000 cd/m². In comparison to similar OLEDs which utilize pure Alq3, the diodes with the Alq3-Dy layer provide an electroluminescence intensity 20 times higher than diodes with a pure Alq3 layer (Alq3 OLED). In addition, the peak position (EL emission band) of the Alq3-Dy OLED is shifted to the higher wavelength side by 10 nm compared to that of the pure Alq3 OLED (from 515 nm to 525 nm).

9 Claims, 10 Drawing Sheets

HIGHLY EFFICIENT ORGANIC LIGHT EMITTING DIODE BASED ON DYSPROSIUM INCORPORATED TRIS-(8-HYDROXYQUINOLINE) ALUMINUM

FIELD OF THE INVENTION

The invention is generally directed to organic light emitting diode (OLED) technology and, more particularly, to an OLED configuration with enhanced luminance and electroluminescence intensity.

BACKGROUND

Organic light-emitting diodes (OLEDs) have attracted considerable interest in the last two decades [1, 2]. These diodes can help in the fabrication of light-weight devices with improved contrast, bright colors, and low power consumption compared to those of liquid crystal displays (LCD) [3, 4]. The fast response and wide viewing angle are additional advantages for the OLED-based displays over the LCDs [5, 6]. OLEDs can also be printed over different types of substrates, which can lead to the realization of low-cost fabrication and flexible displays [7, 8]. The advantages of OLED contribute toward realizing the next generation of flat-panel displays [9]. The size of electronics and devices was drastically reduced because of nanotechnology's significant contributions in this direction, which helped make the devices smaller and more powerful with less power consumption. The required size, composition, and homogeneity should be controlled suitably to explore the desired applications, which include field emission sources, single-electron transistors, chemical and biological sensors, quantum dot lasers, and other optoelectronic devices [10, 11]. Different organic materials, such as polymers [12], dendrimers [13], and small molecules [14-16], are already used to fabricate OLED.

The small molecules, such as triphenylamine and tris(8-hydroxyquinoline) aluminum (Alq3) are preferred because of their tidy molecular structures, control functional properties, and easy to process either by solution or vacuum deposition methods [14]. Alq3 is one of the main molecular organic semiconductors. This material has an efficient luminescence and can work as an electron transporter [17], and efficient fluorescent material/host [18, 19], and a light-emitting layer in the OLEDs [6, 7, 17, 19]. After observing the efficient green electroluminescence of Alq3 in the first fabricated OLED [19], Alq3 has become a valuable and popular choice for OLED display devices and systems. This material has many unique properties, such as high electron mobility and thermal stability, and it can be used to fabricate smooth films easily [20] either by vacuum deposition or by using a solution process. As a result, extensive research has been conducted on Alq3-based OLEDs.

Since the fabrication of the first OLED [19], many studies have been performed using the incorporation method to improve the performance of the Alq3-based OLEDs [4, 21-27]. A decrease in the operating voltage was achieved via the lithium carbonate-doped Alq3 [25] and nitrogen-doped Alq3 as the electron transport layer [24]. A molybdenum oxide-doped hole injector layer was noted to be more effective for a low turn-on voltage and high brightness [27]. Besides, the driving stability of the Alq3-based OLEDs was enhanced by mixing lithium fluoride into the hole transport layer [21]. Besides, the current and luminance efficiency was increased by using many materials incorporating Alq3, such as rubrene and DCJTB [26], TPD, PBD [22], and NPB [4]. An electron only OLED device fabricated using zinc oxide incorporated Alq3 displayed a higher current density compared to that exhibited by pure Alq3 [23]. However, efforts are still ongoing to improve the performance and current efficiency of Alq3-based OLEDs.

In recent years, Salah et al. [28-30] reported upon the incorporation of the Alq3 thin-film nanostructures with different metals, such as silver (Ag), copper (Cu), terbium (Tb), europium (Eu), and dysprosium (Dy). This incorporation has led to improvements in the photoluminescence (PL) intensity of this organic material. In particular, the Dy-incorporated Alq3 (Alq3-Dy) thin film demonstrated a PL intensity improved by a factor of 4 compared to that of the pure Alq3 film. On one hand, Dy is one of the elements in the lanthanides family. On the other hand, the luminescence properties of lanthanides-organic complexes depend strongly upon the ligands nature [31]. Many articles have reported that the metal-organic containing bi-ligands provide stability for the material. In addition, these bi-ligands have extended conjugated chains, which are very important for luminescence [32, 33]. In the lanthanides-organic emitters, the ligands seem to be like sensitizers that help transport the excitation energy to emissive sublevels of the metal ion that lead to maximizing the luminescence [34, 35].

SUMMARY

According to the invention, new OLEDs have been fabricated and evaluated. These OLEDs are based on pure and Dy-incorporated Alq3 as the electron transport layer/emitting material (emissive layer, EML). Three other layers were used in these OLEDs, specifically, those of indium tin oxide (ITO) (anode), N, N0-Di(1-naphthyl)-N, N0-diphenyl-(1, 10-biphenyl)-4,40-diamine (NPB) (hole transporting layer, HTL), and aluminum (Al) (cathode). Alternative materials may be used for the anode, cathode, and HTL. These layers were deposited on a glass substrate (alternative substrates such as a transparent plastic may also be employed). The performance of fabricated OLED with Dy-incorporated Alq3 was substantially better than the OLED with pure Alq3.

DESCRIPTION OF THE DRAWINGS

FIG. 3a shows current density as a function of the applied voltage, inset: electrical conductivity versus T. FIG. 3b shows luminance as a function of the applied voltage. FIG. 3c shows current efficiency as a function of the applied voltage. FIG. 3d shows current efficiency as a function of the luminance.

FIG. 4a is a graph on an EL emission spectra inset: photograph of the fabricated pure Alq3 OLED at an operating voltage of 26 V. FIG. 4b is a graph showing the normalized EL emission spectra inset: photograph of the fabricated Alq3-Dy OLED at an operating voltage of 26 V. FIG. 4c shows CIE coordinates of the EL emission spectra.

DETAILED DESCRIPTION

Figure 1:
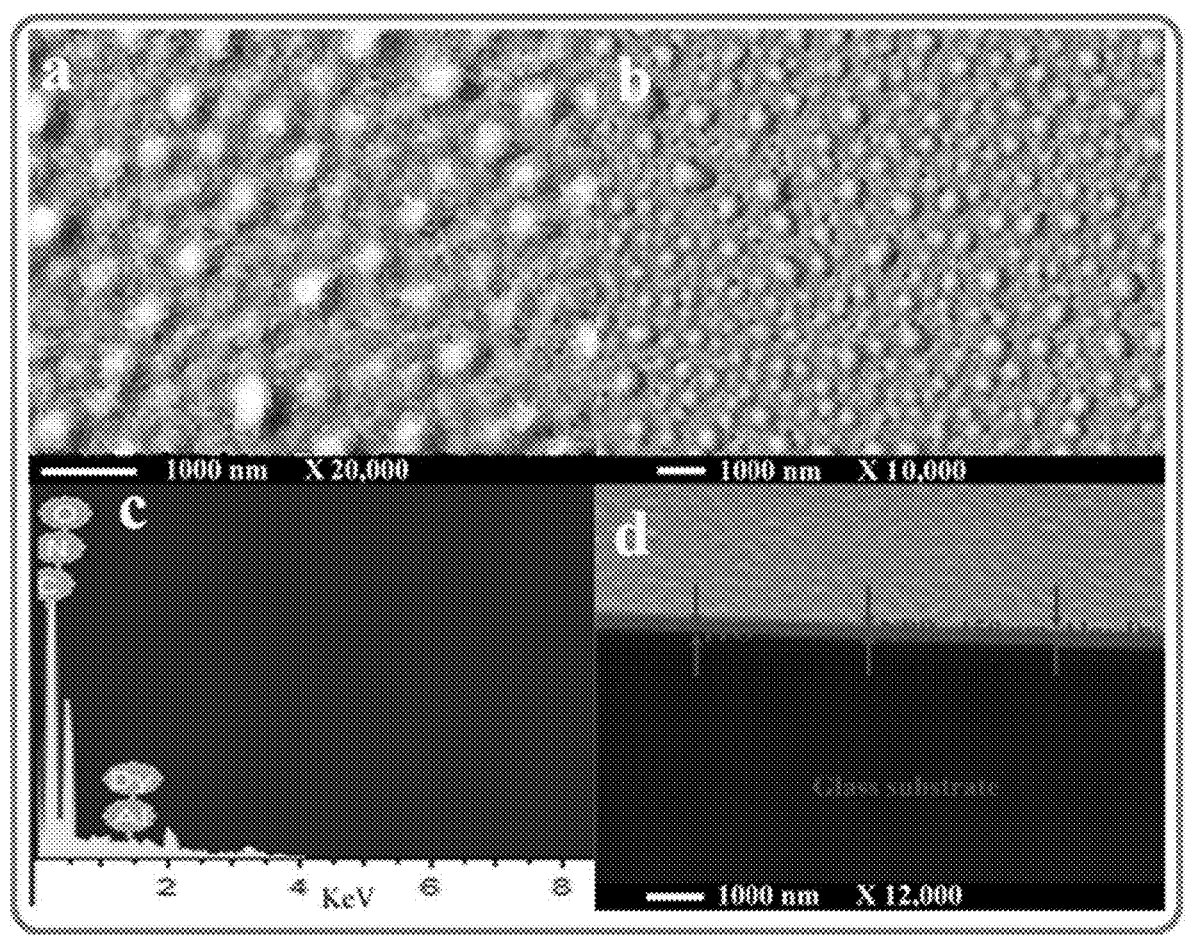
FIG. 1 is a four panel display showing SEM images of (a) the Alq3 film surface, (b) Alq3-Dy film surface, (c) EDX spectrum of the Alq3-Dy film prepared using the thermal evaporation method, and (d) an SEM cross-section image of the Alq3-Dy/NPB/ITO/glass.

All the materials used for the fabrication of the OLED were of reagent grades. To incorporate Dy into the Alq3 host, a weight ratio of Dy to Alq3 was chosen as 1:0.2 according to the optimized results reported J Mater Sci: Mater Electron reported previously [29]. Briefly, 100 mg of DyCl3 was dissolved in 50 ml of double-distilled water; next, 500 mg of Alq3 was added. The resulting solution was subjected to sonication for 4 h. Finally, this solution was dried in an oven at 50° C. for 8 h to obtain Alq3-Dy in a powder form. This dried powder was used to fabricate the Alq3-Dy OLED.

The substrates used for the fabrication of the OLEDs were clean glass slides. A layer of ITO (200 nm) was deposited on the glass substrate as an anode by using an RF sputtering system. Before and after deposition of the ITO, each glass slide was cleaned ultrasonically with acetone, ultrapure water, and isopropyl alcohol. The HTL, EML, and Al electrode layers of the OLED were fabricated using a thermal evaporation method. A carbon boat was used in the thermal evaporation system during the evaporation of the NPB and Alq3-Dy. For the Al layer, Al granulate was placed in a molybdenum boat. The carbon boat was used to increase the temperature of the materials (NPB and Alq3-Dy) gradually to ensure that smooth films could be achieved without fragments.

The chamber was evacuated up to 10-6 Torr before the evaporation process; the pressure was maintained at the same pressure during the deposition of all the layers. Every ITO/glass substrate was fixed at a distance of 10 cm above the boat. The deposition rate and thickness of every deposited layer were monitored using a quartz oscillator, and the thicknesses of all the layers were verified through the scanning electron microscopy (SEM) technique. The HTL (100 nm), that is, NPB, was deposited onto the ITO/glass substrate at a deposition rate of 0.5 A°/s. Next, the EML (150 nm), that is, the powdered Alq3-Dy, was deposited at a deposition rate of 1 A°/s. Finally, the Al electrode layer (200 nm) was deposited as the cathode layer at a deposition rate of 5 A°/s. In the end, the OLED layers were as follows: Al (200 nm)/Alq3-Dy (150 nm)/NPB (100 nm)/ITO (200 nm)/ glass substrate.

Another OLED based on the pure Alq3 was also fabricated with the same methodology for comparison.

The morphology and thickness of the fabricated films were characterized by using a scanning electron microscope (SEM) and atomic force microscope (AFM). The current density-voltage and electroluminescence (EL) emission characteristics were measured using a Keithley, 6517A electrometer/high resistance meter, and a Shimadzu, RF-5301 PC, respectively.

The surface morphology and structural properties of the pure Alq3 and Alq3-Dy powders were examined using SEM. The pure Alq3 sample had long microsized rods with a small percentage of short nano-/microsized rods. The Alq3-Dy sample had nanosized fragments with a small proportion of long microsized rods. This reduction in the rod size may be due to the lengthy sonication, e.g., for 4 h, which led to the breakage of the Alq3 microsized rods in the water medium. The X-ray diffraction (XRD) spectra of the pure Alq3 and Alq3-Dy powders were recorded, and the XRD peaks of the pure powder are similar to those reported earlier [28-30]. These results indicate crystalline powders' presence exhibiting almost similar patterns, with peaks at the expected positions. The XRD result for the Alq3-Dy powder appeared identical to that of the pure Alq3 with no change in the crystal structure or peak positions. The only notable difference found was that the Alq3-Dy powder peaks show low intensities and more broadening for certain peaks. This reduction in the peak intensities is most likely due to the particle size effect, which reduces in the case of the Alq3-Dy powder. The lengthy sonication could also affect the crystallinity and might have generated defects in the structures of the Alq3. This aspect indicates that the Dy ions are likely only physically incorporated on the Alq3 ions' sidewall with no effect on the structure of the Alq3.

Examination of SEM images also demonstrated the layers forming the fabricated OLED device deposited on the glass substrate. ITO was used as the anode (transparent conductive layer), and the second layer, which is the NPB, was used as the HTL in the fabricated OLED. Fine nanoparticles (NPs) of the ITO with a particle size of less than 10 nm were identified in the SEM images. The SEM images also showed the cross section of the deposited ITO layer on the glass substrate, which exhibits a thickness of approximately 200 nm. The surface of the NPB layer exhibits uniform fine nanosphere particles. The cross-section SEM image of the NPB/ITO/glass demonstrated the NPB layer with a uniform thickness of approximately 100 nm. The third layer of the fabricated OLED device was either pure Alq3 or Alq3-Dy.

The morphology of the film surfaces of the pure Alq3 and Alq3-Dy were also studied by recording SEM images. FIG. 1, at panels (a) and (b), shows pure Alq3 and Alq3-Dy films. The nanosphere particles have sizes within the range of 40-60 nm. FIG. 1, at panel (c) shows qualitative energy-dispersive X-ray spectroscopy (EDX) for the Alq3-Dy film, which confirms the presence of Dy at the Alq3 layer. Table 1 presents the elemental composition of the layers in the fabricated OLEDs (where the $3^{rd}$ layer is different for the OLEDs).

TABLE 1

Elemental Analysis of the layers of the Fabricated OLEDs

| Layer | | C | N | O | In | Sn | Al | Dy |
|---|---|---|---|---|---|---|---|---|
| $1^{st}$ | ITO | | | 5.21 | 65.27 | 29.52 | | |
| $2^{nd}$ | NPB | 92.97 | 7.03 | | | | | |

TABLE 1-continued

Elemental Analysis of the layers of the Fabricated OLEDs

| Layer | | C | N | O | In | Sn | Al | Dy |
|---|---|---|---|---|---|---|---|---|
| $3^{rd}$ | pure Alq3 | 69.71 | 11.13 | 15.84 | | | 3.32 | |
| $3^{rd}$ | Dy-Alq3 | 68.33 | 10.01 | 15.41 | | | 3.56 | 1.69 |
| $4^{th}$ | Al | 0.81 | 1.17 | | | | 98.02 | |

The cross-section images of the layers Alq3-Dy, NPB, and ITO on the glass substrate are shown in FIG. 1 at panel (d). The EML can be seen in the top view, and it has a thickness of 150 nm. This thickness value is suitable, as has been reported in the existing literature [20]. To further confirm the morphology of the Alq3 film, AFM images of the pure Alq3 layer were obtained at two different magnifications. Nanosphere particles with sizes ranging from 30 to 50 nm were seen at the surface of the third layer deposited using the thermal evaporation method in the fabricated OLED. These results are similar to those shown in FIG. 1 at panel (a), and they demonstrate satisfactory agreement with the results reported earlier [28-30]. Almost spherical particles with high uniformity were produced. XRD results demonstrated the amorphous nature of the pure Alq3 and Alq3-Dy layers these films, which differs entirely from the powder samples. These results are following those reported by several groups [28-30, 37]. Moreover, these amorphous films exhibit strong photoluminescence emission.

Figure 2:
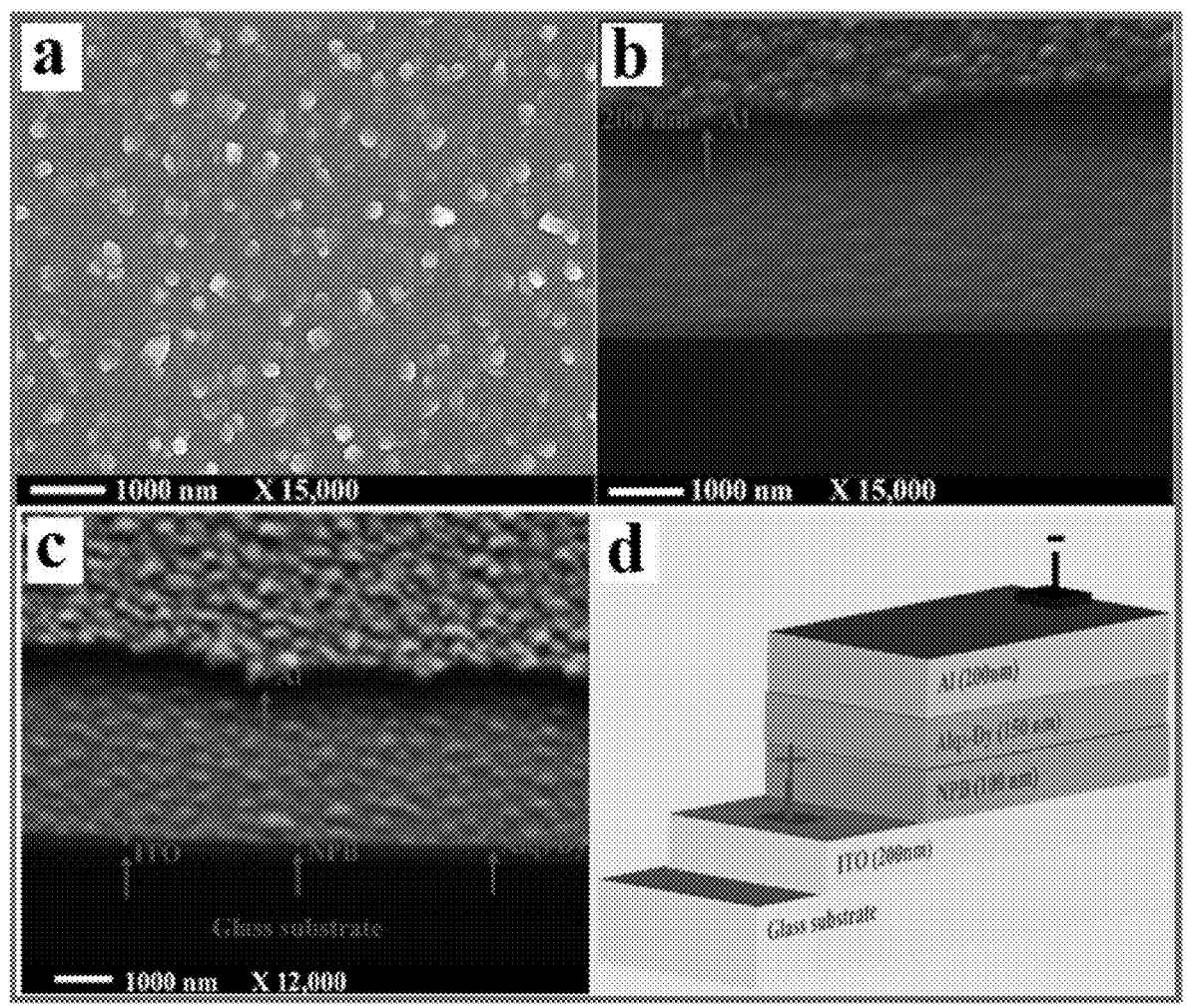
FIG. 2 is a four panel display showing SEM images of (a) the surface of Al thin film deposited as a cathode for the OLED by using the thermal evaporation method, (b) cross section of the Al layer, and (c) the fabricated OLEDs with four layers: Al (200 nm)/pure Alq3 or Alq3-Dy (150 nm)/NPB (100 nm)/ITO (200 nm) deposited onto the glass substrate. The schematic structural diagram for the fabricated OLEDs is shown in FIG. 2 at panel (d).

FIG. 2, at panels (a) and (b) shows SEM images of the Al thin film deposited as the cathode onto the Alq3 or Alq3-Dy/NPB/ITO/glass films by using the thermal evaporation method. Al is well known to have a small and suitable work function to be used for the considered type of devices (OLEDs). FIG. 2 at panel (a) shows the Al layer's surface morphology, which exhibits NPs with almost equal sizes of approximately 80 nm. These NPs form a uniform layer with a thickness of approximately 200 nm. This phenomenon can be clearly observed in the cross-section SEM image presented in FIG. 2 at panel (b). The four layers used to fabricate the present OLED device are shown in a single cross-section SEM image in FIG. 2 at panel (c). The image shows the layers of Al (200 nm)/pure Alq3 or Alq3-Dy (150 nm)/NPB (100 nm)/ITO (200 nm) deposited onto the glass substrate with the surface morphology of the EML and Al electrode films in the top view. From the image, spherical NPs can be observed. The Al electrodes could be designed to have different geometrical shapes. A plastic mask was used to fabricate the strip-like shapes of the Al electrodes. These electrodes were finally connected to the measurement systems. The schematic structural diagram of the OLEDs is also shown in FIG. 2 at panel (d).

Figure 3A:
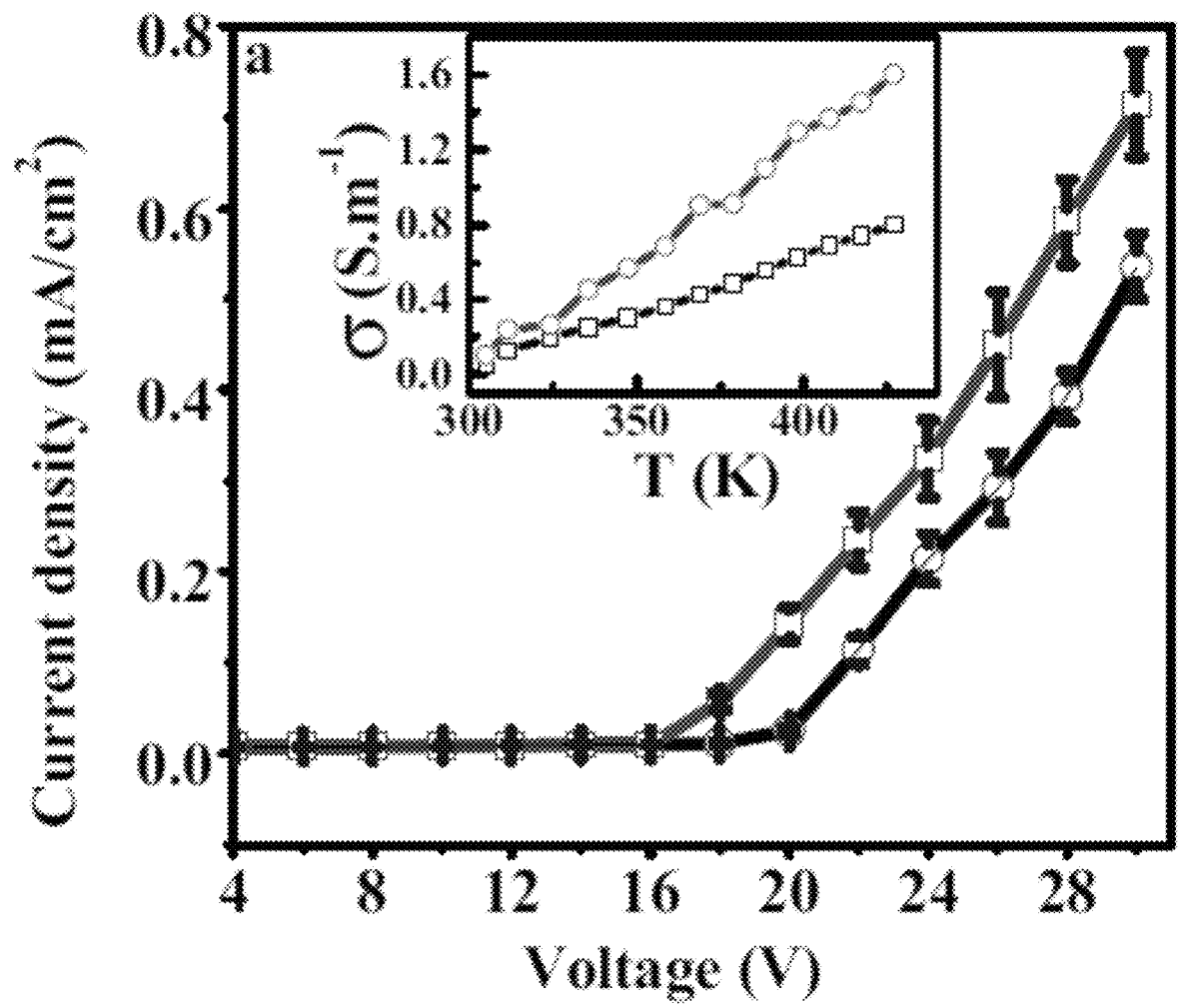
FIGS. 3a-d are graphs showing electrical and luminance characterizations of the fabricated pure Alq3 and Alq3-Dy OLEDs.

FIGS. 3*a-d* show the electrical and luminance characterization of the fabricated pure Alq3 and Alq3-Dy OLEDs. FIG. 3*a* displays the current density-voltage performance of the fabricated OLEDs. It is clear that there exists a significant improvement in the operating voltage of the fabricated Alq3-Dy OLED compared to that of the pure Alq3. The operating voltage was reduced from 20 V in the pure Alq3 OLED to 15 V in the Alq3-Dy OLED. Not to be bound by theory, the electrical conductivity of the dysprosium-incorporated materials may be the cause of this reduction [4]. This hypothesis was validated by measuring pure Alq3 and Alq3-Dy electrical conductivities as a function of the temperature (T). The obtained result is presented in the inset of FIG. 3*a*. As can be seen, the electrical conductivity of the Alq3-Dy is higher than that of the pure Alq3. The operating voltages of the fabricated OLEDs are still relatively high; however, this outcome was expected, as it has been previously reported [38, 39] that the operating voltage of the thicker layers of the OLEDs is relatively higher compared with that of the thinner layers. Therefore, this aspect can be controlled by decreasing the thicknesses of the layers of the OLEDs and adding a hole injector layer (HIL) using metal oxides, such as NiOx and V2O5. Adding an electron injection layer (EIL) may minimize the operating voltage. Furthermore, treating the ITO layer by oxygen plasma and adding PEDOT: PSS layer for smoothening the ITO surface may also lower the operating voltage. Inserting a buffer layer, such as LiF, between the electrode and the organic layer may also reduce the work function of Al.

One objective of the present work was to demonstrate the effect of the Dy incorporation on the OLED performance. Therefore, thicker layers were deposited to avoid the occurrence of a short circuit during the device operation. As shown in FIG. 3*a*, the current density of the Alq3-Dy OLED was higher than that of the pure Alq3 OLED. This enhancement occurred due to the incorporated element in the emissive layer [22] that may enhance the transportation and carrier injection, thereby improving the current density.

Figure 3B:
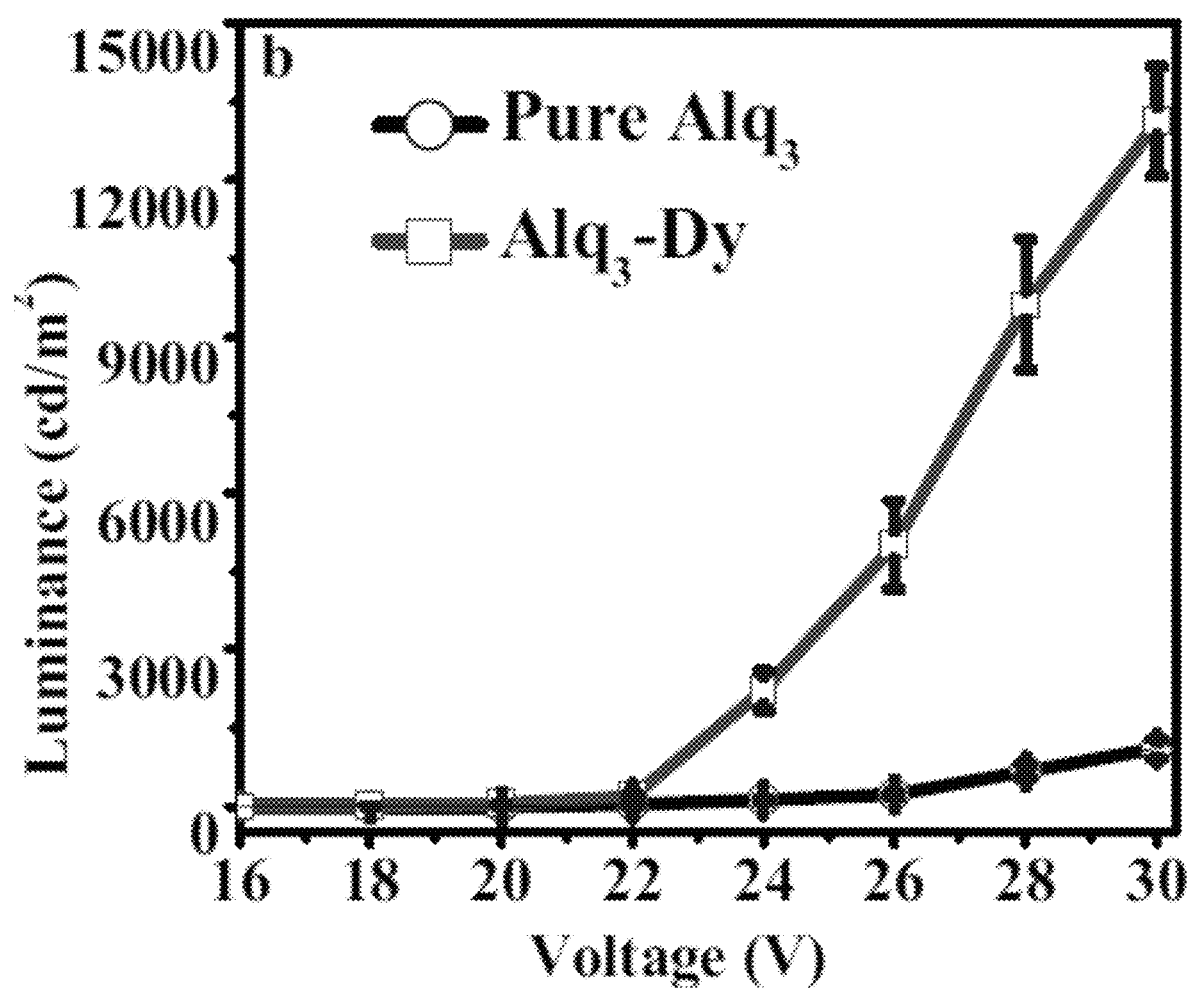

The relationship between the luminance and voltage of the fabricated OLEDs was recorded and presented in FIG. 3*b*. A considerable improvement in the luminance of the Alq3-Dy OLED compared to that of the pure Alq3 OLED can be clearly observed. At a fixed voltage of 26 V, the luminance improved from approximately 250 cd/m2 in the case of the fabricated pure Alq3 OLED to approximately 5000 cd/m2 in the case of the Alq3-Dy.

Figure 3C:
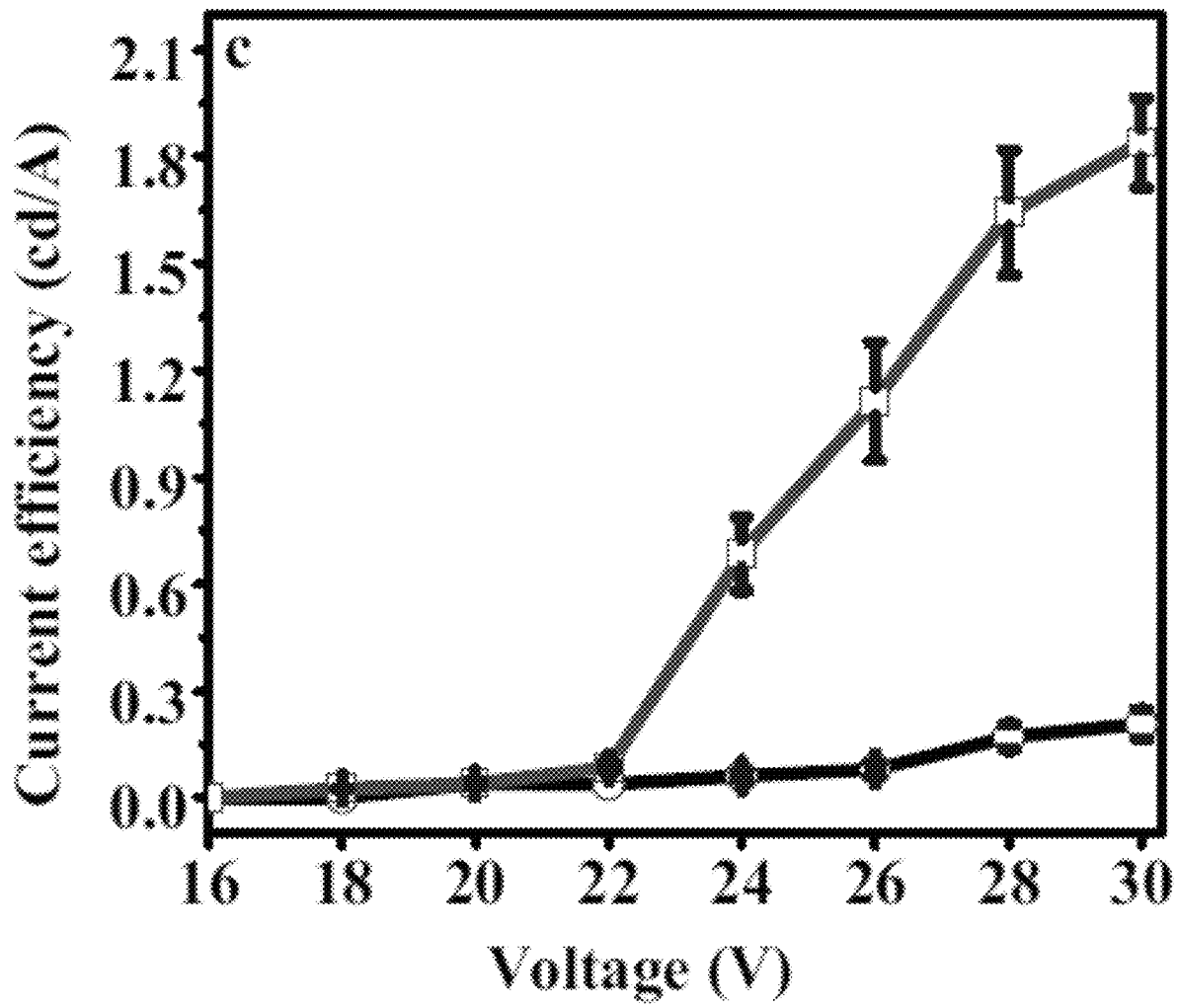

FIG. 3*c* displays the relationship between the current efficiency and voltage. The measured current efficiency of the fabricated Alq3-Dy OLED was found to increase drastically compared with that of the pure Alq3 OLED. A balance of the holes and electrons can cause a higher current efficiency and luminance; therefore, the use of Dy may help enhance the balance of the holes and electrons.

Figure 3D:
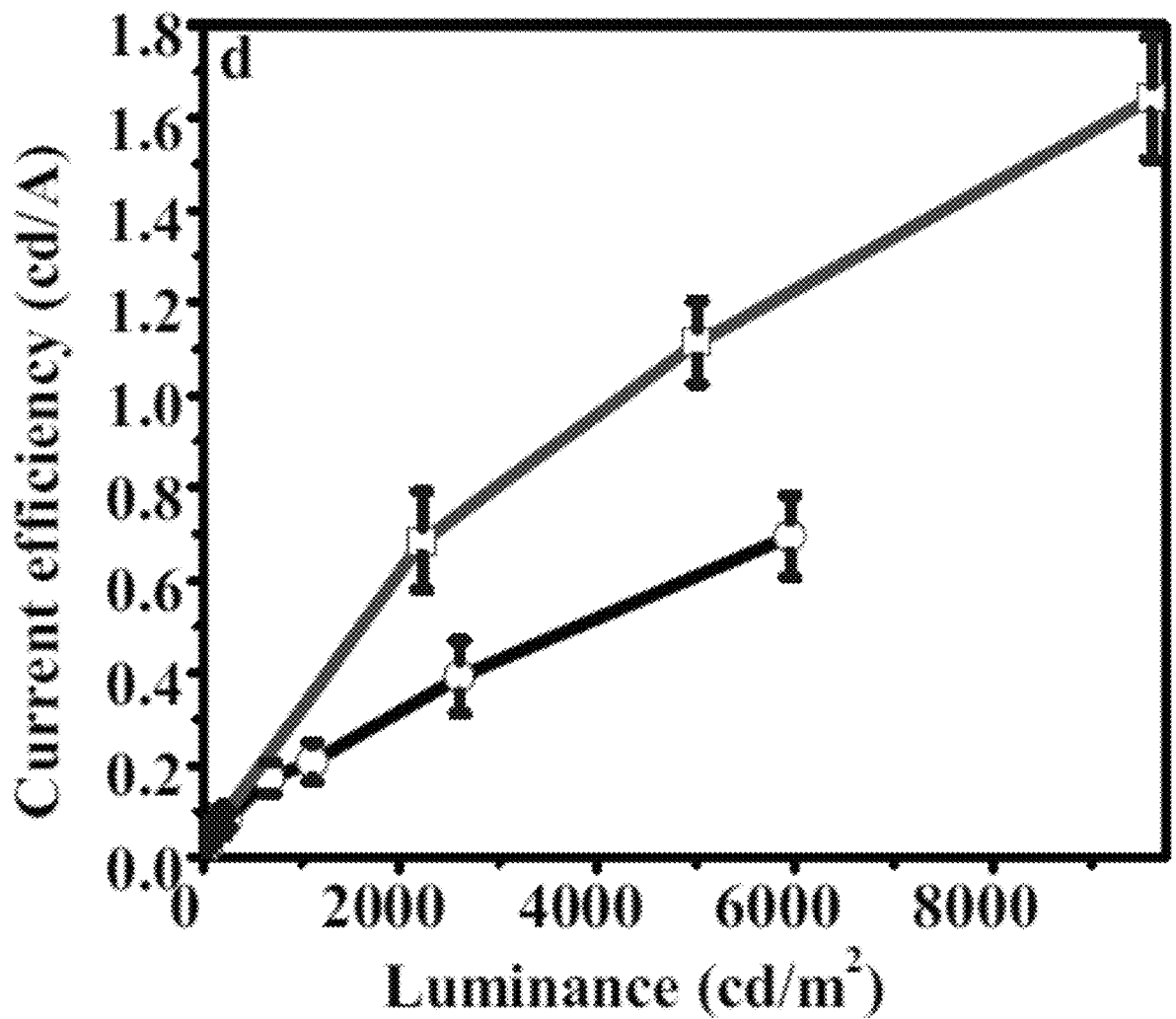

FIG. 3*d* shows the relationship between the current efficiency and luminance; it can be observed that the luminance efficiency of the fabricated Alq3-Dy OLED is higher than that of the pure Alq3 OLED.

The results presented in FIGS. 3*a*-3*d* show that the performance (e.g., operating voltage, efficiency, and luminance) of the Alq3-based OLED was enhanced by incorporating the Alq3 with Dy. The latter was deposited as a metal with the Alq3 to form nanostructures in a thin film form. Such metals in nanostructure forms were reported to produce a localized surface plasmon (LSP) effect [40]. The LSP effect of metallic elements was reported to significantly enhance the local electromagnetic fields [41, 42], which can improve the performance of the optoelectronic devices, such as OLEDs [43, 44].

Figure 4A:
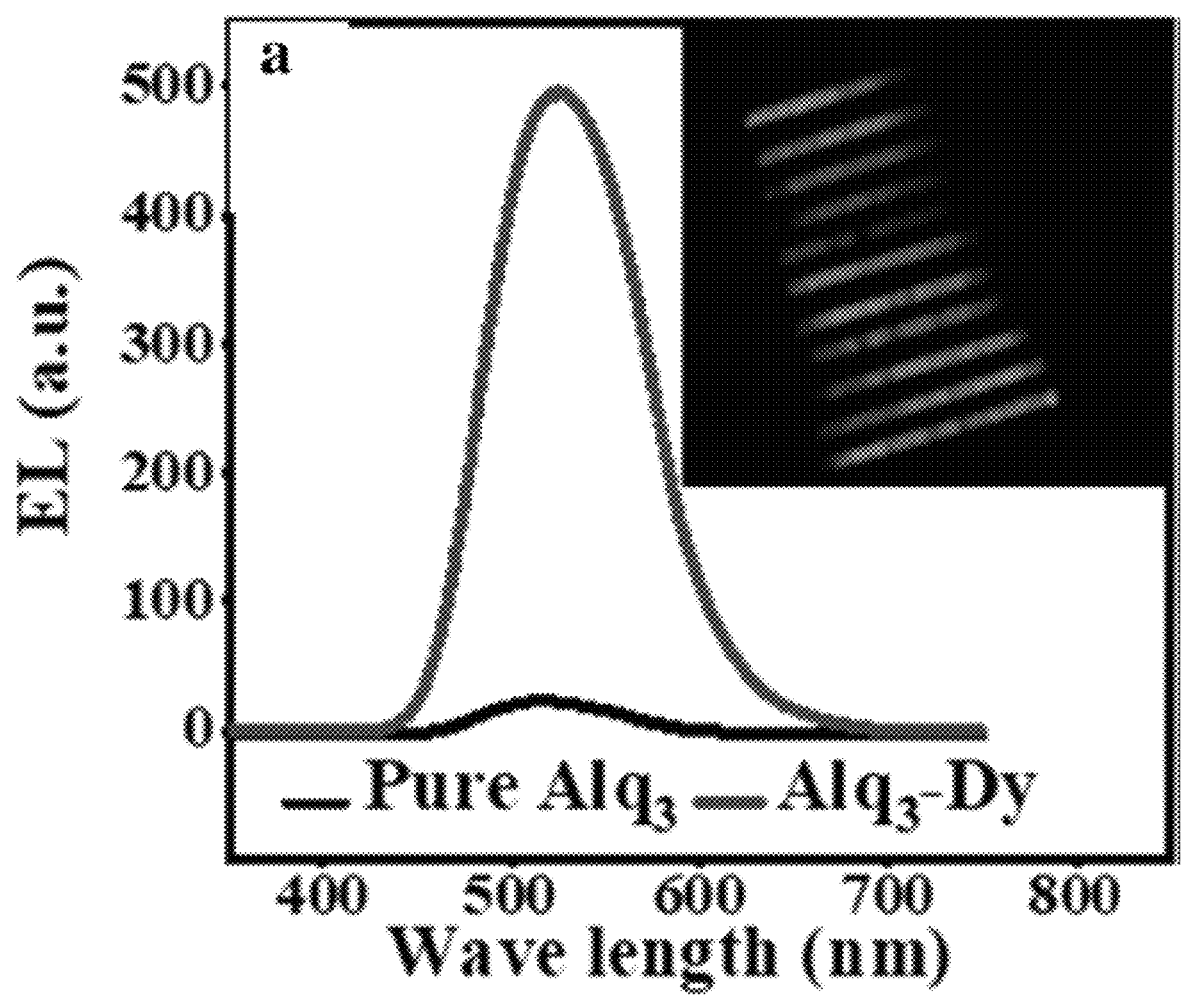
FIGS. 4a-c pertain the electroluminescence (EL) characterization of the fabricated pure Alq3 and Alq3-Dy OLEDs.

As shown in FIG. 4a, the EL emission spectra of the fabricated pure Alq3 and Alq3-Dy OLEDs were recorded at an operating voltage of 26 V. The EL intensity of the fabricated Alq3-Dy OLED was considerably higher than that of the fabricated pure Alq3 OLED by more than 20 times. The emission bands of the fabricated pure Alq3 and Alq3-Dy OLEDs were located at 515 and 525 nm, respectively. The peak position of the Alq3-Dy OLED shifted to the higher wavelength side by approximately 10 nm compared to that of the pure OLED.

Figure 4B:
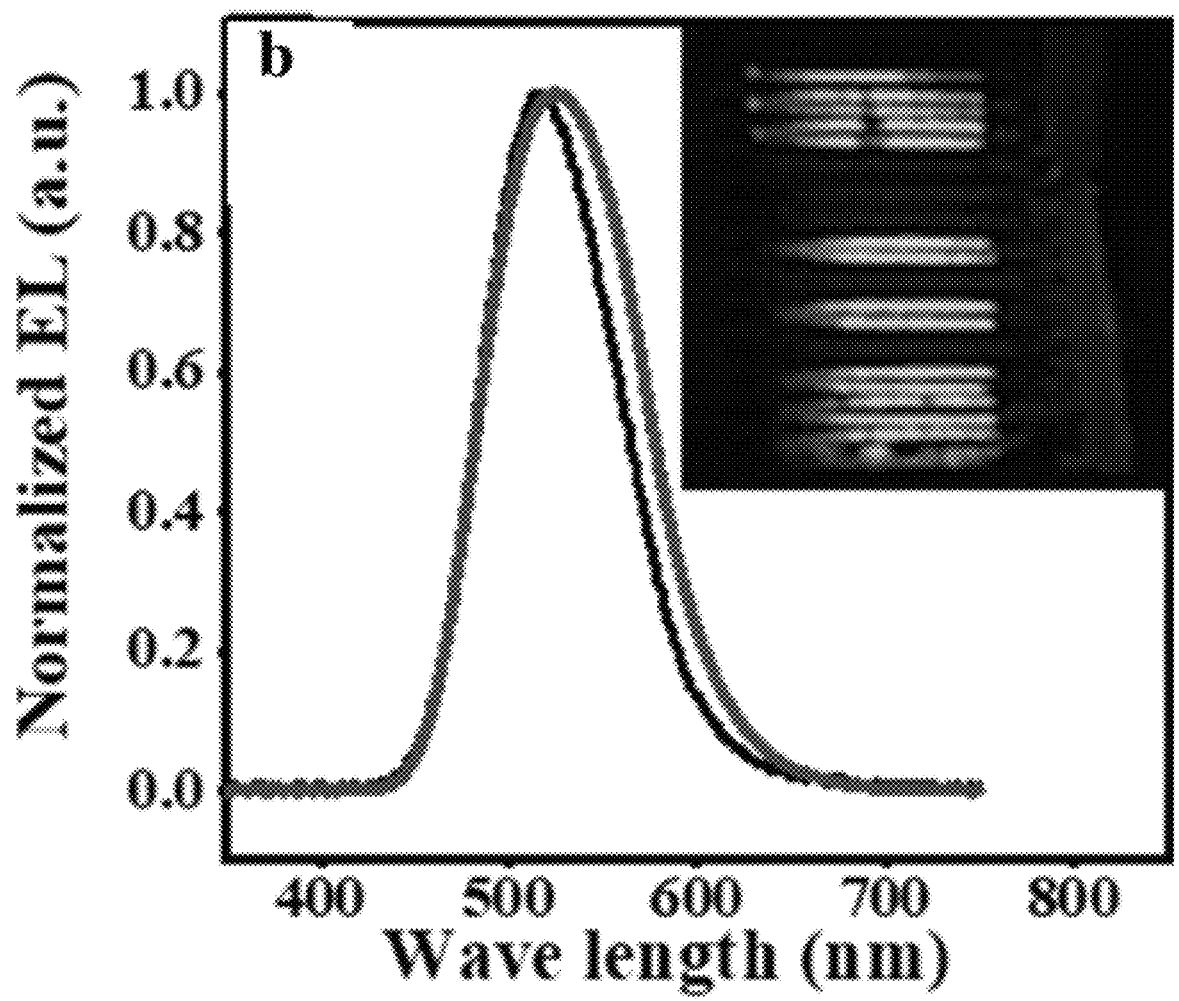

This shift can be seen clearly in the normalized EL emission spectra presented in FIG. 4b. A broadening in the EL emission spectrum of the Alq3-Dy OLED can be seen clearly in FIG. 4b. The full width at half maximum (FWHM) of the EL emission peak of the fabricated pure Alq3 and Alq3-Dy OLEDs were calculated to be 83.3 and 95.7 nm, respectively.

Figure 4C:
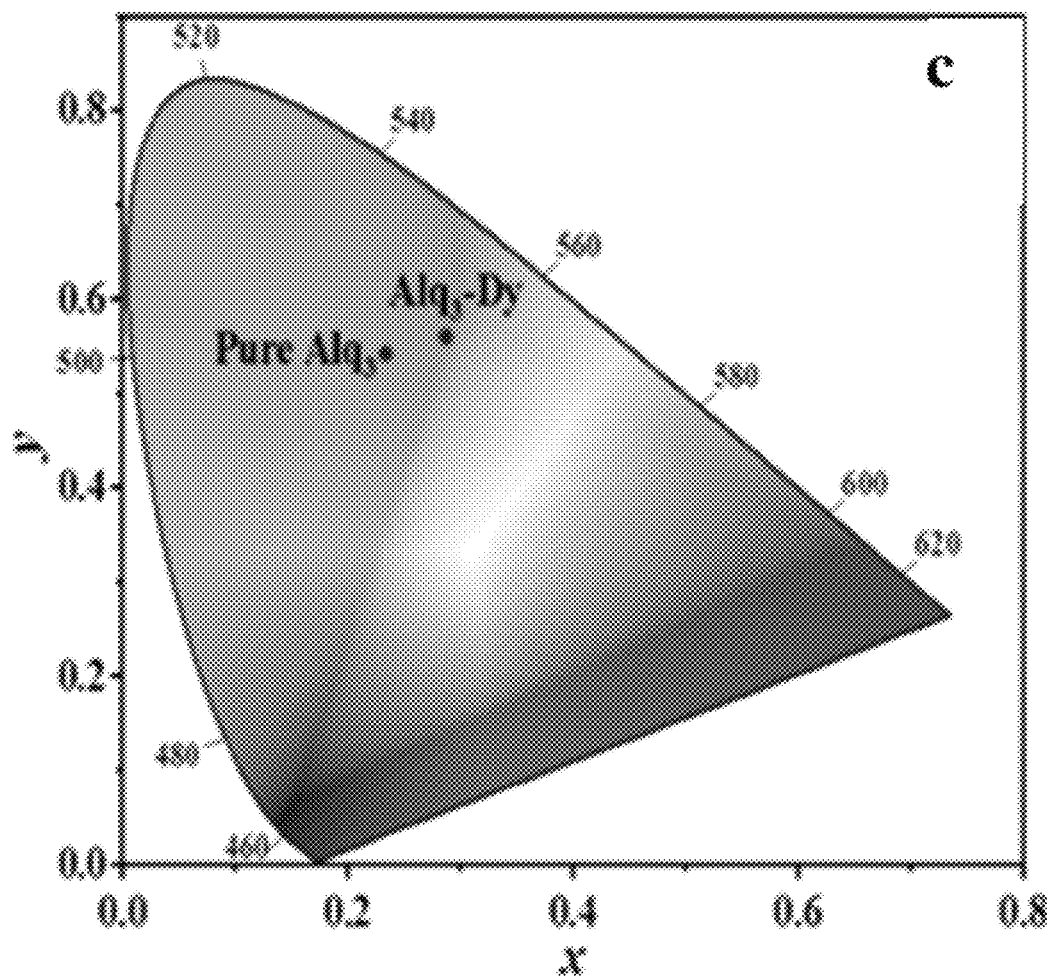

To obtain more insights pertaining to the light output from these OLEDs, the Commission Internationale de l'Eclairage (CIE) color coordinates of the fabricated OLEDs were estimated and are presented in FIG. 4c. The CIE color coordinates were estimated to be (0.234, 0.542) and (0.287, 0.561) for the pure Alq3 and Alq3-Dy OLEDs, respectively.

FIGS. 4a and b exhibit the photographs obtained for an operating voltage of 26 V for the fabricated pure Alq3 and Alq3-Dy OLEDs, respectively. These photos show that the Alq3-Dy exhibits an improved lighting and bright emission generated by the OLED. These results further indicate that the presence of Dy significantly increased the light output compared to that of only the Alq3. This result can help improve the OLEDs' lighting and brightness in display devices and systems in the future. Overall, and not to be bound by theory, the enhanced emission and EL spectrum broadening of the fabricated Alq3-Dy OLED may have resulted from the generation of new emissions channels created by the reaction between the Alq3 molecules' excitons and the LSPs of the Dy metal element.

It was reported that there is a coupling between the surface plasmons and excitons (plexcitons) in the commonly named Purcell effect. This effect can inspire the kinetic characteristics of the molecules to create new channels for the emission. Therefore, this effect leads to creating a hybrid light-matter state with new energy levels that differ from the individual material [45, 46]; this illustrates why the EL peak of pure Alq3 shifted from 515 to 525 nm. In addition, the plexcitons can accelerate the spontaneous emission rate of the system [45, 46].

Figure 5:
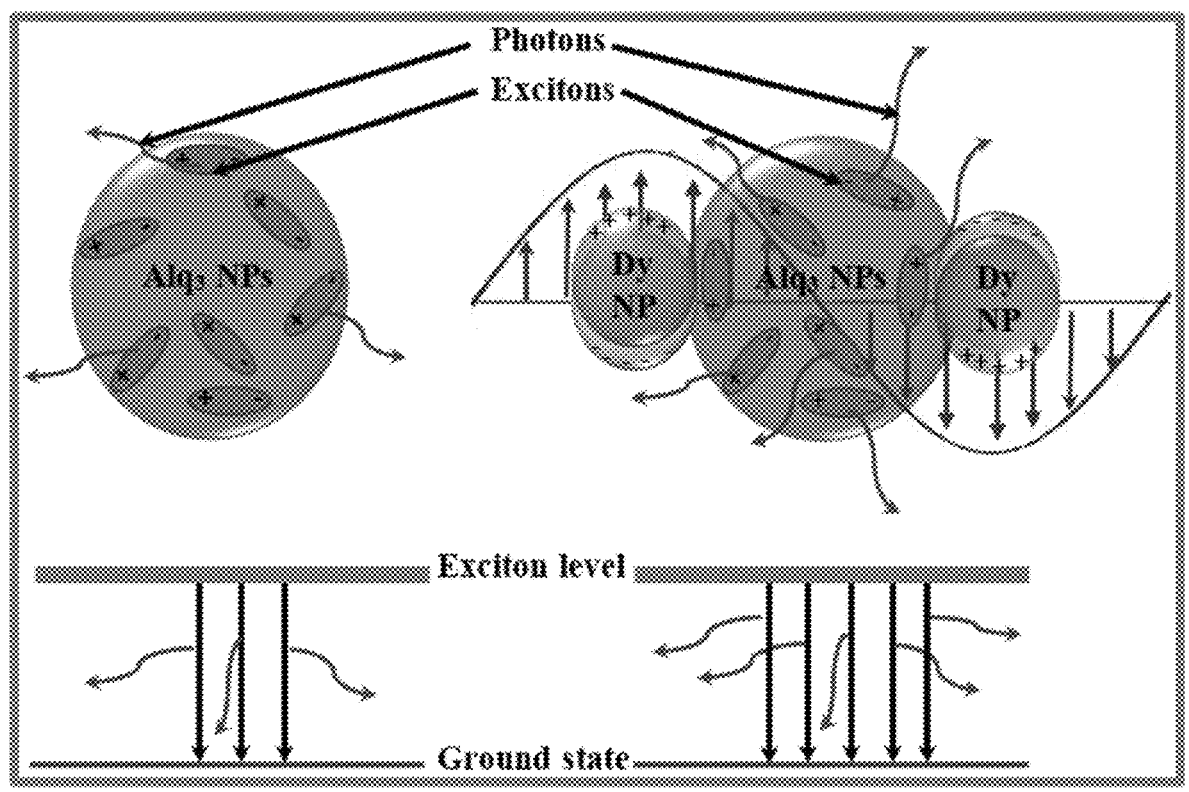
FIG. 5 is a schematic illustration showing the effect of the interaction between the LSPs of the Dy and excitons of the Alq3 NPs.

These plexcitons in the nanostructures of the semiconductor can prolong the lifetime of the excitons in the host of such nanostructures, and therefore, this can considerably increase the quantum yield [47, 48]. FIG. 5 shows the schematic illustrations for LSPs of the Dy metal on the excitons of the semiconductor Alq3 NPs. FIG. 5 summarizes the interaction between these two entities, which finally enhances the emission of the Alq3.

Alq3 incorporated with Dy has been used to design a highly efficient OLED with a turn-on voltage of 15 V. The performance (luminance and current efficiency) of the Alq3-Dy OLED was significantly enhanced compared with those of the pure Alq3 OLED. Besides, the Dy incorporated OLED exhibits improved lighting and induces a higher EL intensity. The EL intensity of this OLED is approximately 25 times higher than that of the pure Alq3 OLED. These results are important for the development of OLEDs and display devices. The technology may be used for creating digital displays in a wide variety of devices such as computer monitors, TV screens, mobile phones, etc.

Exemplary dimensions of layers forming the Dy doped Alq3 OLED (Thickness of the layers) are: Alq3-Dy layer is 150 nm, Al layer is 200 nm, NPB layer is 100 nm, ITO is 200 nm, and the sizes of the nanosphere particles of Alq3-Dy are within the range of 40-60 nm. The thickness of the layers may be varied within the practice of the invention, and each of the layers my be 30-300 nm in thickness.

The manufactured OLED device (based on the Dy doped Alq3), and as is shown by example in FIGS. 3a-d and 4a-c, include (but are not limited to): The recorded luminance value at a fixed voltage of 26 V is enhanced from 250 cd/m$^2$ for the pure Alq3 OLED to 5000 cd/m$^2$ for the Alq3-Dy OLED. The OLED according to the invention can be varied, but will include Alq3-Dy and will have a luminance value at a voltage ranging from 24V to 30V of 3000-15000 cd/m2.

The electroluminescence (EL) intensity of the Alq3-Dy OLED is 20 times higher than that of the Alq3 OLED.

The peak position (EL emission band) of the Alq3-Dy OLED shifted to the higher wavelength side by 10 nm compared to that of the pure OLED (From 515 nm to 525 nm).

The EL emission spectrum of the Alq3-Dy OLED is broader (The full width at half maximum, FWHM is 95.7 nm) than that of the pure Alq3 OLED (The full width at half maximum, FWHM is 83.3 nm).

The electrical conductivity of the Alq3-Dy is higher by a factor of 2 than that of the pure Alq3. This results on reducing the operating voltage from 20 V in the pure Alq3 OLED to 15 V in the Alq3-Dy OLED.

The current density values of the Alq3-Dy OLED above 16 V are higher by a factor within the range 1.2-1.5 times than those of the pure Alq3 OLED.

The current efficiency values as a function of voltage of the Alq3-Dy OLED are higher than those of the pure Alq3 OLED. Above 22 V these values of the Alq3-Dy OLED are higher by a factor within the range 7-10 times than those of the pure Alq3 OLED.

The current efficiency values as a function of luminance of the Alq3-Dy OLED are higher than those of the pure Alq3 OLED. At luminance 4000 cd/m2 the value of the Alq3-Dy OLED is higher by a factor of 2 times than that of the pure Alq3 OLED.

Acknowledgment: The inventors are very thankful for the Research & Consulting Institute at King Abdulaziz University, Jeddah, for their financial support under grant number M(MBD(08/017)).

REFERENCES

1. A. V. Sanchez-Mendoza, V. G. Ibarra-Garcia, J. R. Velazquez-Hernandez, O. J. Hernandez-Ortiz, J. Carrillo, L. Palacios-Huerta, I. Cosine, A. Alvarez-Hernandez, K. Aleman-Ayala, R. A. Vazquez-Garcí'a, Synthesis, chemical, theoretical studies, electrochemical, electrical and optical characterization of novel oligomer 2,2'-((1E,1'E)(2,5-bis(octyloxy)-1,4-phenylenevinylene)bis(6-(E)-2-(vinylquinolin))quinoline for OLED applications. J. Mater. Sci. 30(22), 19718-19730 (2019).
2. G. A. Sosa-Ortiz, V. Alvarez-Venicio, J. O. Guerra-Pulido, V. M. Velazquez-Aguilar, V. A. Basiuk, M. D. P. Carreon-Castro, Fabrication and characterization of an organic light-emitting diode based on Langmuir-Blodgett films using oligo(phenylenevinylene) derivatives. J. Mater. Sci. 31(1), 337-346 (2020).
3. Q. Dong, F. Tai, H. Lian, B. Zhao, Z. Zhong, Z. Chen, J. Tang, F. Zhu, Realization of efficient light out-coupling in organic light-emitting diodes with surface carbon-coated magnetic alloy nanoparticles. *Nanoscale* 9(8), 2875-2882 (2017).
4. L. He, J. Liu, Z. Wu, D. Wang, S. Liang, X. Zhang, B. Jiao, D. Wang, X. Hou, Solution-processed small molecule thin films and their light-emitting devices. *Thin Solid Films* 518(14), 3886-3890 (2010).
5. Z. Wang, Z. Chen, Z. Lan, X. Zhai, W. Du, Q. Gong, Enhancement of Alq3 fluorescence by nanotextured silver films deposited on porous alumina substrates. *Appl. Phys. Lett.* 90(15), 151119 (2007).
6. J. S. Jung, J. W. Lee, M. R. Seo, H. S. Lee, J. Kim, S. W. Lee, J. Joo, Luminescence variation of organic Alq3 nanoparticles on surface of Au nanoparticles and graphene. *Synth. Met.* 162(21), 1852-1857 (2012).
7. D.-J. Jan, S.-S. Wang, S.-J. Tang, K.-Y. Lin, J.-J. Yang, J.-L. Shen, K.-C. Chiu, Growth and characterization of tris(8-hydroxyquinoline)-aluminum molecular films. *Thin Solid Films* 520(3), 1005-1009 (2011).
8. M. C. Tam, H. Su, K. S. Wong, X. Zhu, H. S. Kwok, Surface-plasmon-enhanced photoluminescence from metal-capped Alq3 thin films. *Appl. Phys. Lett.* 95(5), 051503 (2009).
9. Y. Kajiyama, K. Kajiyama, H. Aziz, Diffusion barriers for achieving controlled concentrations of luminescent dopants via diffusion for mask-less RGB color patterning of organic light emitting devices. *Opt. Express* 23(24), 30783-30792 (2015).
10. X. Duan, Y. Huang, Y. Cui, J. Wang, C. M. Lieber, Indium phosphide nanowires as building blocks for nanoscale electronic and optoelectronic devices. *Nature* 409(6816), 66-69 (2001).
11. S. Fan, M. G. Chapline, N. R. Franklin, T. W. Tombler, A. M. Cassell, H. Dai, Self-oriented regular arrays of carbon nanotubes and their field emission properties. *Science* 283(5401), 512 (1999). 12. B. W. D'Andrade, S. R. Forrest, White organic light-emitting devices for solid-state lighting. *Adv. Mater.* 16(18), 1585-1595 (2004
13. A. C. Grimsdale, K. Leok Chan, R. E. Martin, P. G. Jokisz, A. B. Holmes, Synthesis of light-emitting conjugated polymers for applications in electroluminescent devices. *Chem. Rev.* 109(3), 897-1091 (2009).
14. J. Tagare, D. K. Dubey, R. A. K. Yadav, J.-H. Jou, S. Vaidyanathan, Triphenylamine-imidazole-based luminophores for deep-blue organic light-emitting diodes: experimental and theoretical investigations. *Mater. Adv.* 1(4), 666-679 (2020).
15. H. Peng, Z. Wei, L. Wu, X. Li, Efficient non-doped blue fluorescent OLEDs based on bipolar phenanthroimidazoletriphenylamine derivatives. *Opt. Mater.* 101, 109726 (2020).
16. J. Tagare, S. Vaidyanathan, Recent development of phenanthroimidazole-based fluorophores for blue organic light-emitting diodes (OLEDs): an overview. *J. Mater. Chem.* C 6(38), 10138-10173 (2018).
17. C. Cui, D. H. Park, J. Kim, J. Joo, D. J. Ahn, Oligonucleotide assisted light-emitting Alq3 microrods: energy transfer effect with fluorescent dyes. *Chem. Commun.* 49(47), 5360-5362 (2013).
18. C. W. Tang, S. A. VanSlyke, C. H. Chen, Electroluminescence of doped organic thin films. *J. Appl. Phys.* 65(9), 3610-3616 (1989).
19. C. W. Tang, S. A. VanSlyke, Organic electroluminescent diodes. *Appl. Phys. Lett.* 51(12), 913-915 (1987).
20. P. Jiang, W. Zhu, Z. Gan, W. Huang, J. Li, H. Zeng, J. Shi, Electron transport properties of an ethanol-soluble AlQ3-based coordination polymer and its applications in OLED devices. *J. Mater. Chem.* 19(26), 4551-4556 (2009).
21. H.-I. Baek, H.-K. Lee, C. Lee, Enhancement of the OLED driving stability by introducing an LiF-mixed a-NPD hole transport layer, *SPIE* 2006
22. M. A. Mohd Sarjidan, S. H. Basri, W. H. Abd Majid, Fabrication and characterization of organic light-emitting diodes containing small molecules blends as emissive layer. *Adv. Mater. Res.* 795, 106-109 (2013).
23. G. Dasi, R. Ramarajan, K. Thangaraju, Improved electron injection in spin coated Alq3 incorporated ZnO thin film in the device for solution processed OLEDs. *AIP Conf Proc.* 1942(1), 060015 (2018).
24. W. J. Lee, Y. K. Fang, H.-C. Chiang, S. F. Ting, S. F. Chen, W. R. Chang, C. Y. Lin, T. Y. Lin, W. D. Wang, S. C. Hou, J.-J. Ho, Improving turn on voltage and driving voltage of organic electroluminescent devices with nitrogen doped electron transporter. *Solid-State Electron.* 47(5), 927-929 (2003).
25. P.-C. Kao, J.-H. Lin, J.-Y. Wang, C.-H. Yang, S.-H. Chen, Li2CO3 as an n-type dopant on Alq3-based organic light emitting devices. *J. Appl. Phys.* 109(9), 094505 (2011).
26. N. Hai, Z. Bo, T. Xian-Zhong, Significant improvement of OLED efficiency and stability by doping both HTL and ETL with different dopant in heterojunction of polymer/small-molecules. *Chin. Phys.* 16(3), 730-734 (2007).
27. G. Xie, Y. Meng, F. Wu, C. Tao, D. Zhang, M. Liu, Q. Xue, W. Chen, Y. Zhao, Very low turn-on voltage and high brightness tris-(8-hydroxyquinoline) aluminum-based organic light-emitting diodes with a MoOx p-doping layer. *Appl. Phys. Lett.* 92(9), 093305 (2008).
28. N. Salah, S. S. Habib, Z. H. Khan, Highly luminescent material based on Alq3: Ag nanoparticles. J. Fluoresc. 23(5), 1031-1037 (2013).
29. N. A. J. Salah, S A), Memic, Adnan (Jeddah, SA), Al-ghamdi, Attieh A. (Jeddah, SA), Algarni, Sabah Eid (Jeddah, SA), Khan, Zishan H. (New Delhi, IN), Method of making doped Alq3 nanostructures with enhanced photoluminescence, KING ABDULAZIZ UNIVERSITY (Jeddah, SA), United States (2018)
30. N. Salah, S. S. Habib, Z. H. Khan, N. D. Alharbi, Synthesis and characterization of pure and Tb/Cu doped Alq3 nanostructures. *J. Lumin.* 143, 640-644 (2013).
31. A. P. Pushkarev, V. A. Ilichev, A. A. Maleev, A. A. Fagin, A. N. Konev, A. F. Shestakov, R. V. Rumyantzev, G. K. Fukin, M. N. Bochkarev, Electroluminescent properties of lanthanide pentafluorophenolates. *J. Mater. Chem.* C 2(8), 1532-1538 (2014).
32. K. Walzer, B. Ma¨nnig, M. Pfeiffer, K. Leo, Highly efficient organic devices based on electrically doped transport layers. *Chem. Rev.* 107(4), 1233-1271 (2007).
33. L. Xiao, Z. Chen, B. Qu, J. Luo, S. Kong, Q. Gong, J. Kido, Recent progresses on materials for electrophosphorescent organic light-emitting devices. *Adv. Mater.* 23(8), 926-952 (2011).
34. J. C. G. Bunzli, Lanthanide luminescence for biomedical analyses and imaging. *Chem. Rev.* 110(5), 2729-2755 (2010).
35. K. Binnemans, Lanthanide-based luminescent hybrid materials. *Chem. Rev.* 109(9), 4283-4374 (2009).
36. P. Dai, J. Lu, M. Tan, Q. Wang, Y. Wu, L. Ji, L. Bian, S. Lu, H. Yang, Transparent conducting indium-tin-oxide (ITO) film as full front electrode in III-V compound solar cell. *Chin. Phys. B* 26(3), 037305 (2017).

37. M. Cuba, G. Muralidharan, Effect of thermal annealing on the structural and optical properties of tris-(8-hydroxyquinoline)aluminum(III) (Alq3) films. *Luminescence* 30(3), 352-357 (2015).
38. K. Narayan, S. Varadharajaperumal, G. M. Rao, M. M. Varma, T. Srinivas, Effect of thickness variation of hole injection and hole blocking layers on the performance of fluorescent green organic light emitting diodes. *Curr. Appl. Phys.* 13(1), 18-25 (2013).
39. S. Hofle, T. Lutz, A. Egel, F. Nickel, S. W. Kettlitz, G. Gomard, U. Lemmer, A. Colsmann, Influence of the emission layer thickness on the optoelectronic properties of solution processed organic light-emitting diodes. *ACS Photon.* 1(10), 968-973 (2014).
40. S. Zeng, D. Baillargeat, H.-P. Ho, K.-T. Yong, Nanomaterials enhanced surface plasmon resonance for biological and chemical sensing applications. *Chem. Soc. Rev.* 43(10), 3426-3452 (2014).
41. K. L. Kelly, E. Coronado, L. L. Zhao, G. C. Schatz, The optical properties of metal nanoparticles: the influence of size, shape, and dielectric environment. *J Phys. Chem. B* 107(3), 668-677 (2003).
42. W. L. Barnes, A. Dereux, T. W. Ebbesen, Surface plasmon subwavelength optics. *Nature* 424(6950), 824-830 (2003).
43. K. Togashi, S. Nomura, N. Yokoyama, T. Yasuda, C. Adachi, Low driving voltage characteristics of triphenylene derivatives as electron transport materials in organic light-emitting diodes. *J. Mater. Chem.* 22(38), 20689-20695 (2012).
44. M.-K. Kwon, J.-Y. Kim, B.-H. Kim, I.-K. Park, C.-Y. Cho, C. C. Byeon, S.-J. Park, Surface-plasmon-enhanced light-emitting diodes. *Adv. Mater.* 20(7), 1253-1257 (2008
45. D.-D. Zhang, R. Wang, Y.-Y. Ma, H.-X. Wei, Q.-D. Ou, Q.-K. Wang, L. Zhou, S.-T. Lee, Y.-Q. Li, J.-X. Tang, Realizing both improved luminance and stability in organic light-emitting devices based on a solution-processed inter-layer composed of MoOX and Au nanoparticles mixture. *Org. Electron.* 15(4), 961-967 (2014).
46. S. T. Kochuveedu, D. H. Kim, Surface plasmon resonance mediated photoluminescence properties of nanostructured multicomponent fluorophore systems. *Nanoscale* 6(10), 4966-4984 (2014)
47. S. Lambright, E. Butaeva, N. Razgoniaeva, T. Hopkins, B. Smith, D. Perera, J. Corbin, E. Khon, R. Thomas, P. Moroz, A. Mereshchenko, A. Tarnovsky, M. Zamkov, Enhanced lifetime of excitons in nonepitaxial Au/CdS core/shell nanocrystals. *ACS Nano* 8(1), 352-361 (2014
48. T. Ming, H. Chen, R. Jiang, Q. Li, J. Wang, Plasmon-controlled fluorescence: beyond the intensity enhancement. *J. Phys. Chem. Lett.* 3(2), 191-202 (2012).

The invention claimed is:

1. An organic light emitting diode (OLED), comprising:
a cathode layer;
an emissive layer comprised of dysprosium incorporated tris-(8-hydroxyquinoline) aluminum (Alq3-Dy);
a hole transporting layer;
a transparent anode layer; and
a substrate,
wherein the OLED is configured to provide a luminance value at a voltage ranging from 24V to 30V of 3000-15000 cd/m$^2$.

2. The OLED of claim 1 wherein the OLED is configured to have an electroluminescence (EL) intensity 20 times higher than an identically constructed OLED where the emissive layer was pure Alq3 instead of Alq3-Dy.

3. The OLED of claim 1 wherein an electroluminescence (EL) emission band is at least 10 nm higher than an identically constructed OLED where the emissive layer was pure Alq3 instead of Alq3-Dy.

4. The OLED as recited in claim 1 wherein the hole transporting layer is N,N'-di(1-naphthyl)-N,N'-diphenyl-(1,1'-biphenyl)-4,4'-diamine (NPB).

5. The OLED as recited in claim 1 wherein the transparent anode is Indium-tin-oxide (ITO).

6. The OLED as recited in claim 1 wherein the cathode layer is aluminum.

7. The OLED as recited in claim 1 wherein the substrate is glass.

8. The OLED as recited in claim 1 wherein the emissive layer includes nanospheres of Alq3-Dy of 50-60 nm in diameter therein.

9. The OLED as recited in claim 1 wherein each of the layers has a thickness ranging from 30 nm to 300 nm.

* * * * *